(12) United States Patent
Si et al.

(10) Patent No.: US 12,261,178 B2
(45) Date of Patent: Mar. 25, 2025

(54) TRI-GATE PIXEL STRUCTURE, ARRAY SUBSTRATE, AND DISPLAY PANEL

(71) Applicant: Guangzhou China Star Optoelectronics Semiconductor Display Technology Co., LTd., Guangdong (CN)

(72) Inventors: Shuaichen Si, Guangdong (CN); Lu Yang, Guangdong (CN)

(73) Assignee: Guangzhou China Star Optoelectronics Semiconductor Display Technology Co., LTd., Guangzhou (CN)

( * ) Notice: Subject to any disclaimer, the term of this patent is extended or adjusted under 35 U.S.C. 154(b) by 0 days.

(21) Appl. No.: 18/359,854

(22) Filed: Jul. 26, 2023

(65) Prior Publication Data

US 2024/0405027 A1 Dec. 5, 2024

(30) Foreign Application Priority Data

May 31, 2023 (CN) .......................... 202321370647.4

(51) Int. Cl.
*G09G 3/3275* (2016.01)
*G09G 3/20* (2006.01)
*H01L 27/12* (2006.01)

(52) U.S. Cl.
CPC ......... *H01L 27/124* (2013.01); *G09G 3/2003* (2013.01); *G09G 2300/0426* (2013.01); *G09G 2300/0443* (2013.01); *G09G 2300/0804* (2013.01); *G09G 2320/0204* (2013.01)

(58) Field of Classification Search
CPC ................ H01L 27/124; G09G 3/2003; G09G 2300/0426; G09G 2300/0443; G09G 2300/0804; G09G 2320/0204
See application file for complete search history.

(56) References Cited

U.S. PATENT DOCUMENTS

| 2010/0110057 | A1* | 5/2010 | Lee | G02F 1/134309 |
| | | | | 345/90 |
| 2010/0110359 | A1* | 5/2010 | Lee | G02F 1/136286 |
| | | | | 349/149 |
| 2011/0032241 | A1* | 2/2011 | Jeong | G09G 3/3614 |
| | | | | 345/212 |
| 2011/0037934 | A1* | 2/2011 | Kang | G02F 1/136259 |
| | | | | 438/34 |
| 2013/0100005 | A1* | 4/2013 | Shih | G02F 1/136286 |
| | | | | 438/34 |
| 2014/0078032 | A1* | 3/2014 | Xia | G02F 1/136286 |
| | | | | 257/59 |
| 2017/0184934 | A1* | 6/2017 | Hao | G02F 1/136213 |
| 2018/0047752 | A1* | 2/2018 | Du | H01L 27/124 |
| 2018/0157135 | A1* | 6/2018 | Wang | G02F 1/134309 |

(Continued)

*Primary Examiner* — Ibrahim A Khan
(74) *Attorney, Agent, or Firm* — PV IP PC; Wei Te Chung

(57) ABSTRACT

Embodiments of the present disclosure are directed to a pixel structure, an array substrate, and a display panel. The pixel structure comprises a plurality of gate lines arranged horizontally parallel and a plurality of data lines arranged vertically parallel, with the gate lines and the data lines vertically intersecting to form a plurality of sub pixel areas. The present disclosure improves the uniformity of the display panel image by adding new electrode lines and arranging them parallel to the fewer data lines in the pixel structure while ensuring the pixel opening rate.

15 Claims, 2 Drawing Sheets

(56) References Cited

U.S. PATENT DOCUMENTS

| | | | |
|---|---|---|---|
| 2019/0049806 A1* | 2/2019 | Dai | G09G 3/3607 |
| 2019/0369452 A1* | 12/2019 | Long | G02F 1/1368 |
| 2021/0223584 A1* | 7/2021 | Fan | G02F 1/134309 |
| 2021/0405483 A1* | 12/2021 | Yang | G02F 1/136286 |
| 2022/0129097 A1* | 4/2022 | Chen | G06F 3/0412 |
| 2023/0185141 A1* | 6/2023 | Chen | G02F 1/134309 |
| | | | 349/33 |
| 2023/0360579 A1* | 11/2023 | Zhou | G09G 3/3677 |
| 2023/0367163 A1* | 11/2023 | Zhang | G02F 1/1368 |

* cited by examiner

TRI-GATE PIXEL STRUCTURE, ARRAY SUBSTRATE, AND DISPLAY PANEL

CROSS REFERENCE TO RELATED APPLICATION

This application claims priority to Chinese Application No. 202321370647.4, filed on May 31, 2023. The entire disclosure of the above application is incorporated herein by reference.

FIELD OF THE INVENTION

The present disclosure relates to the field of display technology, more particularly, to a trigate pixel structure, an array substrate, and a display panel.

BACKGROUND

When designing pixel structures, it is necessary to ensure that the voltage is evenly distributed within the pixel structure to ensure the normal display of the display panel. In the display panel, using a three-grid pixel drive structure can reduce the number of data lines and drive costs, thereby reducing production costs. But the number of gate lines in the tri-gate pixel driver structure has greatly increased. If a conventional pixel structure design is used to ensure uniform voltage distribution, it will cause a decrease in the opening rate of the pixel structure.

SUMMARY

Embodiments of the present disclosure are directed to a tri-gate pixel structure, an array substrate, and a display panel, aiming to solve the problem of uneven display of images caused by uneven voltage distribution of tri-gate pixels in the prior art.

In a first aspect of the present disclosure, a tri-gate pixel structure includes a plurality of gate lines arranged horizontally in parallel, a plurality of data lines arranged vertically in parallel, and an electrode line, arranged vertically. The plurality of gate lines and the plurality of data lines intersect to define a plurality of sub pixel areas. The plurality of sub pixel areas comprises a target sub pixel area in which a target sub pixel is disposed, and the target sub pixel area is bound by a first data line located on the left side of the target sub pixel and a second data line located on the right side of the target sub pixel. The electrode line is disposed between the left side of the first data line and the target sub pixel, or the electrode line is disposed between the right side of the second data line and the target sub pixel.

Optionally, the tri-gate pixel structure further comprises a common electrode layer formed in the sub pixel areas, and electrically connected to the electrode line through a via hole.

Optionally, the common electrode layer and the electrode line are connected to an electrical signal input terminal.

Optionally, the tri-gate pixel structure further comprises a plurality of thin film transistors arranged in the sub pixel areas. Each of the sub pixel areas is correspondingly provided with one of the plurality of thin film transistors, and the thin film transistor in each of the sub pixel areas is connected to the data line and the gate line in the corresponding sub pixel area.

Optionally, the tri-gate pixel structure further comprises a pixel electrode layer. The pixel electrode layer is arranged below the common electrode layer, and is connected to the thin film transistor.

Optionally, the tri-gate pixel structure further comprises two electrode lines arranged in parallel and located on left and right sides of the target sub pixel area.

Optionally, in the vertical direction, the electrode line is located in the same layer as the data lines, and the electrode line and the data lines are independent of each other.

Optionally, the electrode line and the data lines are made of the same material.

In a second aspect of the present disclosure, an array substrate includes the tri-gate pixel structure.

In a third aspect of the present disclosure, a display panel includes a color film substrate and an array substrate. The color film substrate is provided with a shading unit. The array substrate which is arranged opposite to the color film substrate comprises a tri-gate pixel structure. The tri-gate pixel structure includes a plurality of gate lines arranged horizontally in parallel, a plurality of data lines arranged vertically in parallel, and an electrode line, arranged vertically. The plurality of gate lines and the plurality of data lines intersect to define a plurality of sub pixel areas. The plurality of sub pixel areas comprises a target sub pixel area in which a target sub pixel is disposed, and the target sub pixel area is bound by a first data line located on the left side of the target sub pixel and a second data line located on the right side of the target sub pixel. The electrode line is disposed between the left side of the first data line and the target sub pixel, or the electrode line is disposed between the right side of the second data line and the target sub pixel.

Optionally, the tri-gate pixel structure further comprises a common electrode layer formed in the sub pixel areas, and electrically connected to the electrode line through a via hole.

Optionally, the common electrode layer and the electrode line are connected to an electrical signal input terminal.

Optionally, the tri-gate pixel structure further comprises a plurality of thin film transistors arranged in the sub pixel areas. Each of the sub pixel areas is correspondingly provided with one of the plurality of thin film transistors, and the thin film transistor in each of the sub pixel areas is connected to the data line and the gate line in the corresponding sub pixel area.

Optionally, the tri-gate pixel structure further comprises a pixel electrode layer. The pixel electrode layer is arranged below the common electrode layer, and is connected to the thin film transistor.

Optionally, the tri-gate pixel structure further comprises two electrode lines arranged in parallel and located on left and right sides of the target sub pixel area.

Optionally, in the vertical direction, the electrode line is located in the same layer as the data lines, and the electrode line and the data lines are independent of each other.

Optionally, the electrode line and the data lines are made of the same material.

Embodiments of the present disclosure are directed to a new pixel structure, an array substrate, and a display panel. The pixel structure comprises a plurality of gate lines arranged horizontally parallel and a plurality of data lines arranged vertically parallel, with the gate lines and the data lines vertically intersecting to form a plurality of sub pixel areas. A plurality of subpixels with different colors are prepared in the sub pixel areas, and the subpixels with different colors are arranged vertically, while the subpixels with the same color are arranged horizontally. The pixel structure also comprises at least one electrode line, which is parallel to the data line of a target sub pixel area itself in the sub pixel areas, and at least one electrode line is disposed between the target sub pixel area and the corresponding data line on the left side, or at least one electrode line is disposed between the target sub pixel area and the corresponding data line on the right side. The present disclosure improves the uniformity of the display panel image by adding new electrode lines and arranging them parallel to the fewer data lines in the pixel structure while ensuring the pixel opening rate.

BRIEF DESCRIPTION OF THE DRAWINGS

To describe the technical solutions in the embodiments of this application more clearly, the following briefly introduces the accompanying drawings required for describing the embodiments. Apparently, the accompanying drawings in the following description show merely some embodiments of this application, and a person of ordinary skill in the art may still derive other drawings from these accompanying drawings without creative efforts.

DESCRIPTION OF THE EMBODIMENTS

Figure 1:
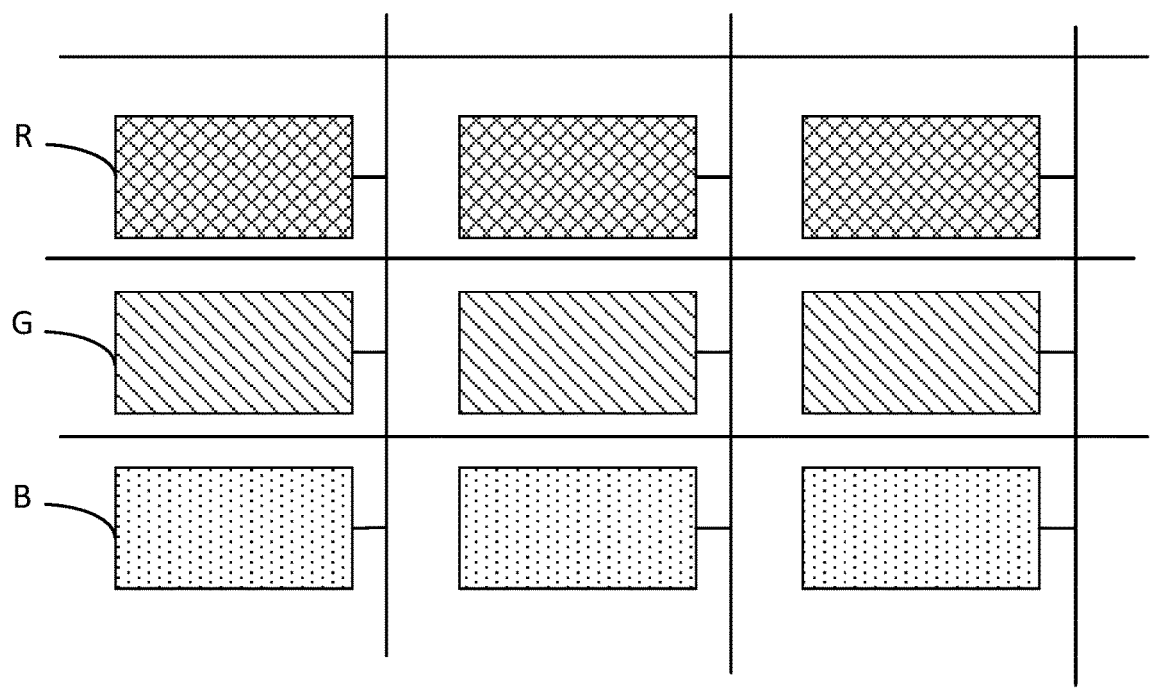
FIG. 1 is a schematic diagram of a conventional pixel structure according to one embodiment of the present disclosure.

For the purpose of description rather than limitation, the following provides such specific details as a specific system structure, interface, and technology for a thorough understanding of the application. However, it is understandable by persons skilled in the art that the application can also be implemented in other embodiments not providing such specific details. In other cases, details of a well-known apparatus, circuit and method are omitted to avoid hindering the description of the application by unnecessary details.

In the disclosure, it is should be understood that spatially relative terms, such as "center", "longitudinal", "lateral", "length", "width", "above", "below", "front", "back", "left", "right", "horizontal", "vertical", "top", "bottom", "inner", "outer", "clockwise", "counterclockwise", "axial", "radial", "circumferential", and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The spatially relative terms are not limited to specific orientations depicted in the figures. In addition, the term "first", "second" are for illustrative purposes only and are not to be construed as indicating or imposing a relative importance or implicitly indicating the number of technical features indicated. Thus, a feature that limited by "first", "second" may expressly or implicitly include at least one of the features. In the description of the present disclosure, the meaning of "plural" is two or more, unless otherwise specifically defined.

All of the terminologies containing one or more technical or scientific terminologies have the same meanings that persons skilled in the art understand ordinarily unless they are not defined otherwise. For example, "arrange," "couple," and "connect," should be understood generally in the embodiments of the present disclosure. For example, "firmly connect," "detachably connect," and "integrally connect" are all possible. It is also possible that "mechanically connect," "electrically connect," and "mutually communicate" are used. It is also possible that "directly couple," "indirectly couple via a medium," and "two components mutually interact" are used.

In the description of this specification, the description of the terms "one embodiment", "some embodiments", "examples", "specific examples", or "some examples", and the like, means to refer to the specific feature, structure, material or characteristic described in connection with the embodiments or examples being included in at least one embodiment or example of the present disclosure. In the present specification, the term of the above schematic representation is not necessary for the same embodiment or example. Furthermore, the specific feature, structure, material, or characteristic described may be in combination in a suitable manner in any one or more of the embodiments or examples. In addition, it will be apparent to those skilled in the art that different embodiments or examples described in this specification, as well as features of different embodiments or examples, may be combined without contradictory circumstances.

In the present disclosure, unless definite regulation and limitation, a first feature "above" or "under" a second feature may include direct contact of the first and second features. A first feature "above" or "under" a second feature may also include first feature contacting the second feature via other features between the first and second features rather than contact directly. Moreover, the first feature "above," "over," or "on" the second feature means that the first feature is over or above the second feature or that the level of the first feature is merely higher than the level of the second feature. The first feature "below," "under," or "beneath" the second feature means that the first feature is under or below the second feature or that the level of the first feature is merely lower than the level of the second feature.

One embodiment of the present disclosure is directed to a tri-gate pixel structure, an array substrate, and a display panel. The following are detailed explanations.

The pixel structure of the present disclosure is applicable to the tri-gate pixel structure, as shown in FIG. 1, which is a schematic diagram of a conventional pixel structure according to one embodiment of the present disclosure. The pixel structure comprises a plurality of gate lines arranged horizontally and a plurality of data lines arranged vertically, with the gate lines and the data lines intersecting to form a plurality of sub pixel areas. The sub pixel areas are prepared with a plurality of sub pixels, which comprise the sub pixels with the same color and the sub pixels with different colors. In the tri-gate pixel structure, the sub pixels with different colors are arranged vertically, while the sub pixels with the same color are arranged horizontally. A plurality of red sub pixels R, a plurality of green sub pixels G, and a plurality of blue sub pixels B with different colors are arranged vertically. A certain row of the sub pixels all have the same color, such as the red sub pixels.

Figure 2:
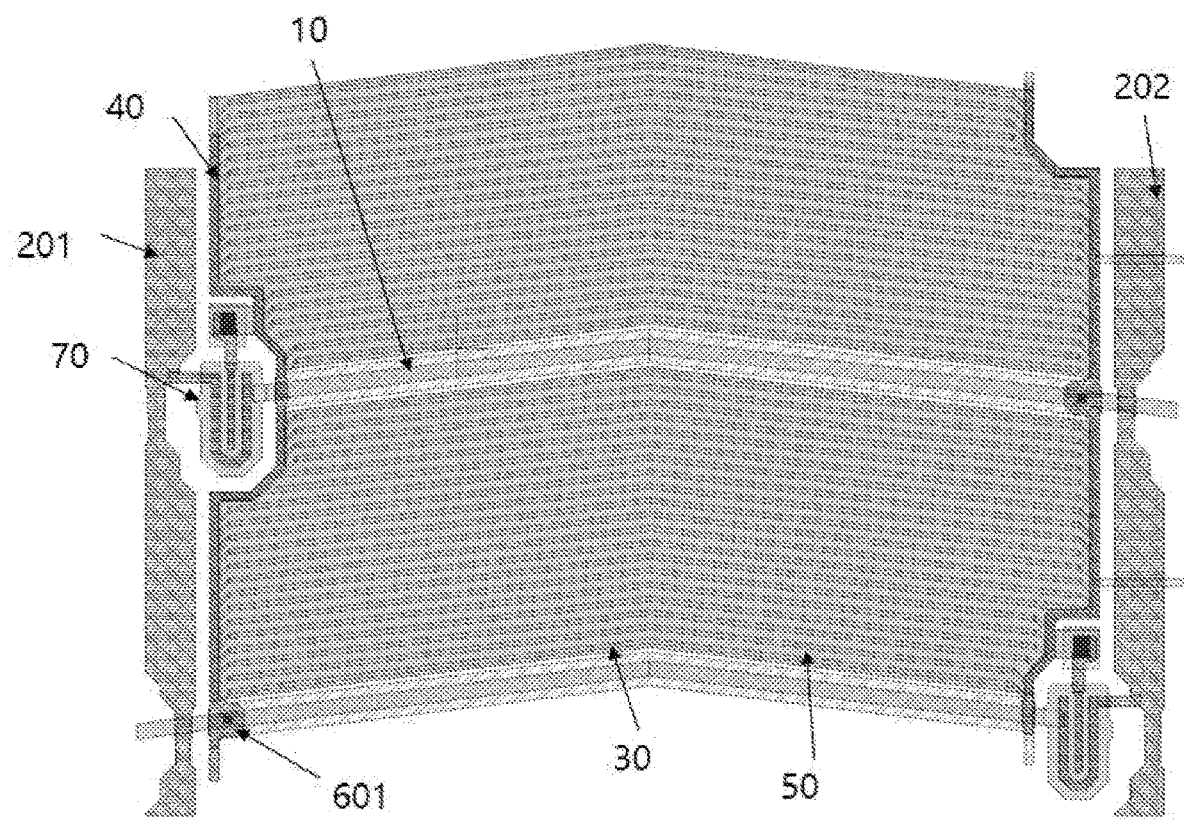
FIG. 2 is a top view of a pixel structure according to one embodiment of the present disclosure.

As shown in FIG. 2, which is a top view of a pixel structure according to one embodiment of the present disclosure. The pixel structure comprises a plurality of gate lines 10 arranged in horizontal parallel and a plurality of data lines 20 arranged in vertical parallel, and the gate lines 10 and the data lines 20 intersect vertically to form a plurality of sub pixel areas 30. Preparing a plurality of sub pixels separately in the sub pixel areas. The sub pixels with different colors are arranged vertically, while the sub pixels with the same color are arranged horizontally. The red and green sub pixels are arranged vertically. In other embodiments, more sub pixels may also be included, and FIG. 2 is only an example.

In FIG. 2, the pixel structure further comprises at least one vertically arranged electrode line 40, and at least one vertically arranged electrode line 40 is arranged parallel to the data line 20. Specifically, each of the sub pixel areas 30 comprises a target sub pixel area, which is surrounded by two parallel and opposite gate lines 10, as well as the first and second data lines 201 and 202 respectively, and in which the target sub pixel area is prepared. The first data line 201 is vertically arranged and located on the left side of the target sub pixel, while the second data line 202 is vertically arranged and located on the right side of the target sub pixel. The at least one vertically arranged electrode line 40 is parallel to the two first and second data lines 201 and 202 corresponding to the target sub pixel area itself. And the at least one vertically electrode line 40 is disposed between the left side of the target sub pixel and the first data line 201. Or the at least one vertically electrode line 40 is disposed between the right side of the target sub pixel and the second data line 202. The following is a detailed explanation of the top and cross-sectional views combined with the pixel structure.

Figure 3:
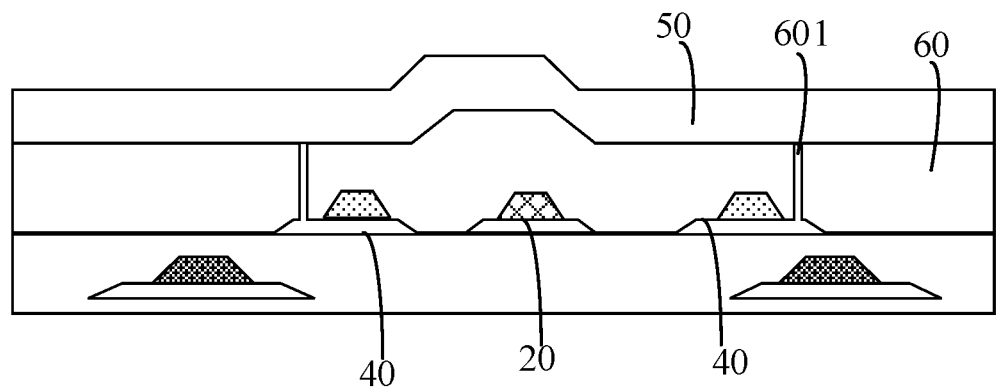
FIG. 3 is a cross-sectional view of the pixel structure according to one embodiment of the present disclosure.

As shown in FIG. 3, which is a cross-sectional view of the pixel structure according to one embodiment of the present disclosure. The pixel structure also comprises a common electrode layer 50, which forms the sub pixel areas. However, in the vertical direction, the common electrode layer 50 and the sub pixels are located in different layers, i.e., at different horizontal heights. The pixel structure shown in FIG. 2 is actually obtained by continuously stacking a plurality of film layers, and the common electrode layer 50 in FIG. 1 is also located in the sub pixel areas and covers a plurality of pixel electrodes and the sub pixels below.

Two adjacent sub pixels are separated by the data lines, and the sub pixels, the data line 20, and the common electrode layer 50 are all located in different film layers. The at least one vertically arranged electrode line 40 and the data line 20 newly added in the present disclosure are located in the same layer. And in the horizontal direction, the electrode line 40 is located on the left or right side of the data line 20. Compared to the data line 20, the electrode line 40 is closer to the sub pixel. In FIG. 2, a target sub pixel is prepared in the target sub pixel area, regardless of whether at least one electrode line 40 is located on the left or right side of the target sub pixel, a minimum distance disposed between the electrode line 40 and the target sub pixel is less than a minimum distance disposed between the data line 20 and the target sub pixel.

For the electrode line 40 of the present disclosure, in the vertical direction, the electrode line 40 is located in the same layer as the data line 20, while the common electrode layer 50 is located above the data line 20 and separated from the data line 20 through an insulation layer 60. However, a via hole 601 is also formed on the insulation layer 60 located above the data line 20, and the common electrode layer 50 is electrically connected to at least one electrode line 40 through the via hole 601 disposed on the insulation layer 60. Therefore, the common electrode layer 50 and the at least one vertically arranged electrode line 40 are connected to an input end of the same electrical signal. And the electrical signal is usually a fixed voltage electrical signal.

The pixel structure of the present disclosure also comprises a plurality of thin film transistors 70, which are correspondingly arranged in the sub pixel areas, and each of the sub pixel areas corresponds to one of the thin film transistors 70. And the thin film transistors 70 in each of the sub pixel areas is connected to the data line and gate line in the corresponding sub pixel area. The thin film transistors need to be connected to the gate lines and the data lines to receive external picture signals using the data lines and the gate lines. The pixel structure also comprises a pixel electrode layer, which is disposed below the common electrode layer 50 and blocked by the common electrode layer 50. The pixel electrode layer is also connected to the thin film transistors 70.

The pixel structure of the present disclosure is applicable to the tri-gate pixel structure, where the number of the gate lines in the tri-gate pixel structure is greater than the number of the data lines. If the electrode lines are arranged parallel to the gate lines, it will cause an excessive number of the electrode lines and affect the opening rate. Therefore, in the present disclosure, the electrode lines will be arranged parallel to the data lines to avoid affecting the opening rate due to the excessive number of electrode lines. Secondly, the electrode lines of the present disclosure is located in the same layer as the data lines, while it is located in a different layer from the common electrode layer. However, a via hole is disposed to connect the common electrode layer and the electrode lines, so that the electrode lines and the common electrode layer are connected to the same electrical signal. The connection of the electrode lines and the common electrode layer to the same electrical signal can ensure that the electrical signal transmitted to the sub pixels does not change or undergo significant attenuation, thereby ensuring that the electrical signal in each of the sub pixels is the same and ensuring the uniformity of the voltage corresponding to each of the sub pixels.

Therefore, the pixel structure usually comprises two electrode lines and the two electrode lines are arranged in parallel. The two parallel electrode lines are located on the left and right sides of each of the data lines. Please refer to FIG. 2. For the first data line 201 in FIG. 1, the sub pixel located on the left side of the first data line 201 corresponds to an electrode line, while the sub pixel located on the right side of the first data line 201 also corresponds to an electrode line. Therefore, except for the data lines at the edge position, an electrode line is disposed on both sides of other data lines. And in the actual pixel structure, as the pixel structure also comprises the thin film transistor 70, the electrode line 40 is not a straight line, but comprises a straight line part and a bent part located around the thin film transistor 70. The electrode line 40 also needs to be connected to the thin film transistor, and the specific connection method may be arranged according to actual needs.

In the above embodiments, the pixel structure comprises a plurality of electrode lines arranged in parallel. Please refer to FIG. 2, two electrode lines are provided, and the two electrode lines are located on the left and right sides of the target sub pixel area. In other embodiments, when a number of electrode lines is greater than 2, the electrode lines are also located on the left and right sides of the sub pixel area, or the two electrode lines are correspondingly disposed on the left and right sides of the data lines. Of course, this situation requires excluding sub pixel areas located at the edge positions, or rather excluding the data lines located at the edge positions.

In the embodiment of the present disclosure, regardless of the number of electrode lines, the electrode lines are located in the same layer as the data lines, and the electrode lines and the data lines are independent of each other and do not overlap with each other. And a preparation material of the electrode line is also the same as a preparation material of data lines. In this embodiment, which allows for the simultaneous preparation of electrode lines and data lines using the same materials and processes when preparing data lines, without the need for additional processing. And since the electrode line and the data line are located in the same layer, and the electrode line is disposed around the data line, the electrode line may to some extent shield the electric field generated by the data line, thereby improving the vertical crosstalk problem.

The embodiment of the present disclosure is also directed to an array substrate, which comprises a tri-gate pixel structure as described above. The specific structure of the array substrate may refer to the previous content, and it will not be elaborated here.

The embodiment of the present disclosure is also directed to a display panel, which comprises an array substrate as described previously, including a tri-gate pixel structure as described in the previous embodiments. The display panel also comprises a color film substrate arranged opposite to the array substrate, and a black matrix 80 is also arranged on the color film substrate. Among the data lines, a target data line is provided, and the two electrode lines on the left and right sides of the target data line. In the horizontal direction, a minimum distance disposed between the two electrode lines on the left and right sides of the target data line is less than a width of a shading unit.

Figure 4:
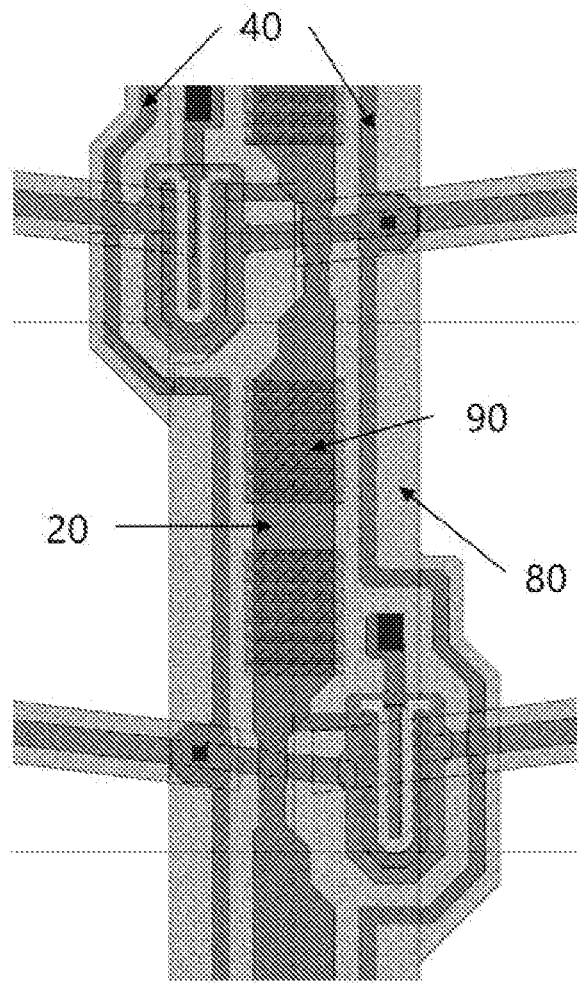
FIG. 4 is a top view of a display panel according to one embodiment of the present disclosure.

As shown in FIG. 4, which is a top view of a display panel according to one embodiment of the present disclosure. The display panel also comprises a support column 90, which is vertically arranged above and corresponding to the position of the gate line 10. In this way, the support column 90 blocks part of the gate line 10. In order to further block the gate line 10 and the support column 90, it is necessary to form a shading unit 80 disposed on a square of the gate line and corresponding to the position of the gate line. In order to completely block the gate line 10 and the support column 90, a width of the shading unit 80 disposed in the horizontal direction is usually arranged to be greater than a width of the gate line 10. And it usually exceeds an edge of the gate line by more than 30 um on both sides. The electrode line 40 of the present disclosure is arranged parallel to the gate line 10. However, due to the fact that the width of the shading unit 80 disposed in the horizontal direction exceeds the width of the gate line 10 by a large amount, even if the electrode line is newly added, the shading unit 80 may simultaneously cover the electrode line 40 and the original gate line 10. In this way, even if additional electrode lines 40 are added, the width of the original shading unit 80 will not be increased, and additional process and cost will not be added.

It should be noted that the above display panel embodiments only describe the above structure. It can be understood that in addition to the above structure, the display panel in the embodiment of the present invention can also include any other necessary structures as needed, such as buffer layer, interlayer dielectric layer (ILD), etc., which are not limited thereto.

In the above-mentioned embodiments, the descriptions of each embodiment have their own emphases. For the part that is not described in detail in a certain embodiment, refer to the detailed description of other embodiments above, and will not be repeated here.

During specific implementation, each of the above units or structures may be implemented as an independent entity, or may be combined arbitrarily to be implemented as the same or several entities. For the specific implementation of the above units or structures, reference may be made to the foregoing method embodiments, and details are not repeated here.

While the present invention has been described in connection with what is considered the most practical and preferred embodiments, it is understood that this invention is not limited to the disclosed embodiments but is intended to cover various arrangements made without departing from the scope of the broadest interpretation of the appended claims.

What is claimed is:

1. A tri-gate pixel structure, comprising:
a plurality of gate lines, arranged in parallel, each of the gate lines extending laterally;
a plurality of data lines, arranged in parallel, each of the data lines extending longitudinally, with the plurality of gate lines and the plurality of data lines intersecting to define a plurality of sub pixel areas; and
a first electrode line and a second electrode line, extending longitudinally;
wherein the plurality of sub pixel areas comprises a target sub pixel area in which a target sub pixel is disposed, and the target sub pixel area is bound by a first data line and a second date line of the plurality of date lines that are adjacent and located respectively on laterally opposite sides of the target sub pixel; and
wherein the first electrode line is disposed between the first data line and the target sub pixel, and the second electrode line is disposed between the second data line and the target sub pixel.

2. The tri-gate pixel structure as claimed in claim 1, further comprising a common electrode layer formed in the sub pixel areas, and electrically connected to the first electrode line and the second electrode line through via holes.

3. The tri-gate pixel structure as claimed in claim 2, wherein the common electrode layer, the first electrode line and the second electrode line are connected to an electrical signal input terminal.

4. The tri-gate pixel structure as claimed in claim 2, further comprising a plurality of thin film transistors arranged in the sub pixel areas, wherein each of the sub pixel areas is correspondingly provided with one of the thin film transistors connected to one of the date lines and the one of the gate lines in the each of the sub pixel areas.

5. The tri-gate pixel structure as claimed in claim 4, further comprising a pixel electrode layer, wherein the pixel electrode layer is arranged below the common electrode layer, and is connected to the one of the thin film transistors.

6. The tri-gate pixel structure as claimed in claim 1, wherein in a vertical direction, the first electrode line and the second electrode line are located in the same layer as the data lines, and the first electrode line, the second electrode line, and the data lines are independent of each other.

7. The tri-gate pixel structure as claimed in claim 1, wherein the first electrode line, the second electrode line, and the data lines are made of the same material.

8. An array substrate, comprising the tri-gate pixel structure as claimed in claim 1.

9. A display panel, comprising:
a color film substrate, provided with a shading unit; and
an array substrate, arranged opposite to the color film substrate, comprising a tri-gate pixel structure;
wherein the tri-gate pixel structure comprises:
a plurality of gate lines, arranged in parallel, each of the gate lines extending laterally;
a plurality of data lines, arranged in parallel, each of the data lines extending longitudinally, with the plurality of gate lines and the plurality of data lines intersecting to define a plurality of sub pixel areas; and a first electrode line and a second electrode line extending longitudinally, wherein the plurality of sub pixel areas comprises a target sub pixel area in which a target sub pixel is disposed, and the target sub pixel area is bound by a first data line and a second date line of the plurality of date lines that are adjacent and located respectively on laterally opposite sides of the target sub pixel; and wherein the first electrode line is disposed between the first data line and the target sub pixel, and the second electrode line is disposed between the second data line and the target sub pixel.

10. The display panel as claimed in claim 9, wherein the tri-gate pixel structure further comprises a common electrode layer formed in the sub pixel areas, and electrically connected to the first electrode line and the second electrode line through via holes.

11. The display panel as claimed in claim 10, wherein the common electrode layer, the first electrode line and the second electrode line are connected to an electrical signal input terminal.

12. The display panel as claimed in claim 10, wherein the tri-gate pixel structure further comprises a plurality of thin film transistors arranged in the sub pixel areas, wherein each of the sub pixel areas is correspondingly provided with one of the thin film transistors connected to one of the date lines and one of the gate lines in the each of the sub pixel areas.

13. The display panel as claimed in claim 12, wherein the tri-gate pixel structure further comprises a pixel electrode layer, wherein the pixel electrode layer is arranged below the common electrode layer, and is connected to the one of the thin film transistors.

14. The display panel as claimed in claim 9, wherein in a vertical direction, the first electrode line and the second electrode line are located in the same layer as the data lines, and the first electrode line, the second electrode line, and the data lines are independent of each other.

15. The display panel as claimed in claim 9, wherein the first electrode line, the second electrode line, and the data lines are made of the same material.

* * * * *